US012575468B2

(12) United States Patent
De Santa et al.

(10) Patent No.: US 12,575,468 B2
(45) Date of Patent: Mar. 10, 2026

(54) ROUGHENED SURFACE OF A CONDUCTIVE WEDGE BONDED RIBBON ENCAPSULATED IN A SERMICONDUCTOR PACKAGE

(71) Applicant: STMicroelectronics S.r.l., Agrate Brianza (IT)

(72) Inventors: Matteo De Santa, Agrate Brianza (IT); Mauro Mazzola, Calvenzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 619 days.

(21) Appl. No.: 17/959,619

(22) Filed: Oct. 4, 2022

(65) Prior Publication Data

US 2023/0114535 A1      Apr. 13, 2023

(30) Foreign Application Priority Data

Oct. 7, 2021      (IT) ........................ 102021000025523

(51) Int. Cl.
H01L 23/00 (2006.01)
H01L 21/56 (2006.01)
(Continued)

(52) U.S. Cl.
CPC .............. H01L 24/84 (2013.01); H01L 21/56 (2013.01); H01L 23/3107 (2013.01); H01L 23/3142 (2013.01); H01L 23/49575 (2013.01); H01L 23/5386 (2013.01); H01L 24/37 (2013.01); H01L 24/40 (2013.01); H01L 24/41 (2013.01); H01L 25/072 (2013.01); *H01L 24/32* (2013.01);
(Continued)

(58) Field of Classification Search
CPC ......... H01L 24/84; H01L 24/37; H01L 24/40; H01L 24/41; H01L 21/56; H01L 23/3142; H01L 23/49575; H01L 2924/181; H01L 2224/45014; H01L 25/072; H01L 23/3107
See application file for complete search history.

(56) References Cited

U.S. PATENT DOCUMENTS 7,443,018 B2 * 10/2008 Ong .................. H01L 23/49562
257/784
8,513,811 B2 * 8/2013 Minotti .................. H01L 24/40
257/691

(Continued)

FOREIGN PATENT DOCUMENTS

CN      102768965 A      11/2012
CN      111725085 A      9/2020
(Continued)

OTHER PUBLICATIONS

IT Search Report and Written Opinion for priority application, IT 102021000025523, report dated May 4, 2022, 8 pgs.
(Continued)

*Primary Examiner* — Alonzo Chambliss
(74) *Attorney, Agent, or Firm* — Crowe & Dunlevy LLC

(57) ABSTRACT

A semiconductor die and an electrically conductive ribbon are arranged on a substrate. The electrically conductive ribbon includes a roughened surface. An insulating encapsulation is molded onto the semiconductor die and the electrically conductive ribbon. The roughened surface of the electrically conductive ribbon provides a roughened coupling interface to the insulating encapsulation.

18 Claims, 4 Drawing Sheets

(51) Int. Cl.

| | |
|---|---|
| *H01L 23/31* | (2006.01) |
| *H01L 23/495* | (2006.01) |
| *H01L 23/538* | (2006.01) |
| *H01L 25/07* | (2006.01) |

(52) U.S. Cl.
CPC .... *H01L 24/73* (2013.01); *H01L 2224/32245* (2013.01); *H01L 2224/37124* (2013.01); *H01L 2224/37147* (2013.01); *H01L 2224/40245* (2013.01); *H01L 2224/45014* (2013.01); *H01L 2224/73263* (2013.01); *H01L 2224/84031* (2013.01); *H01L 2224/84039* (2013.01); *H01L 2224/84047* (2013.01); *H01L 2224/84205* (2013.01); *H01L 2224/84931* (2013.01); *H01L 2224/84939* (2013.01); *H01L 2224/84947* (2013.01); *H01L 2924/181* (2013.01)

(56) References Cited

U.S. PATENT DOCUMENTS

| | | | |
|---|---|---|---|
| 9,082,868 B2 * | 7/2015 | Lee | H01L 24/41 |
| 11,728,309 B2 * | 8/2023 | Levardo | H01L 24/73 |
| | | | 257/727 |

| | | | |
|---|---|---|---|
| 2002/0047187 A1 | 4/2002 | Nakajima et al. | |
| 2005/0212101 A1 * | 9/2005 | Funato | H01L 24/40 |
| | | | 257/E23.044 |
| 2009/0294934 A1 * | 12/2009 | Shi | H01L 24/37 |
| | | | 257/670 |
| 2018/0204739 A1 | 7/2018 | Abbott | |
| 2020/0176342 A1 | 6/2020 | Choi et al. | |
| 2023/0005826 A1 * | 1/2023 | Villa | H01L 23/49548 |
| 2023/0032786 A1 * | 2/2023 | De Santa | H01L 23/49562 |

FOREIGN PATENT DOCUMENTS

| | | |
|---|---|---|
| CN | 219303608 U | 7/2023 |
| EP | 1191589 A2 | 3/2002 |
| WO | 2016132453 A1 | 8/2016 |

OTHER PUBLICATIONS

CN First Office Action and Search Report for counterpart CN Appl. No. 202211266083.X, report dated Aug. 13, 2025, 10 pgs.

* cited by examiner

FIG. 4
FIG. 5
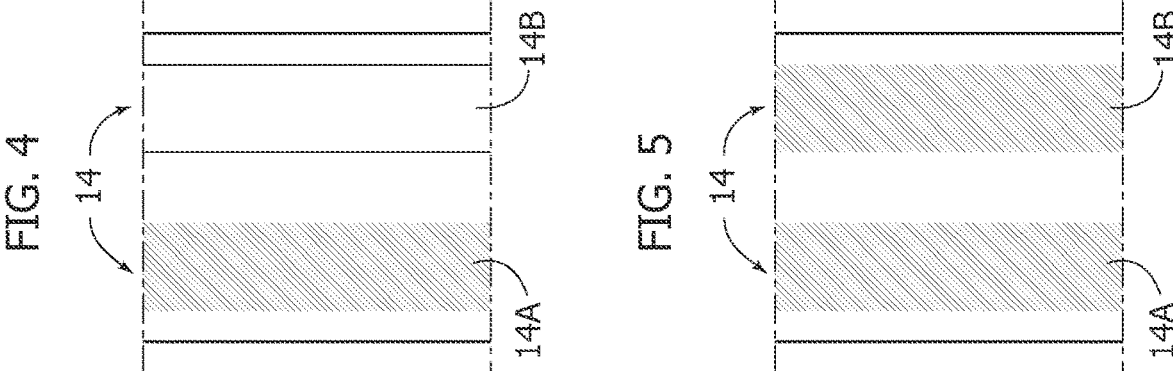
FIG. 3
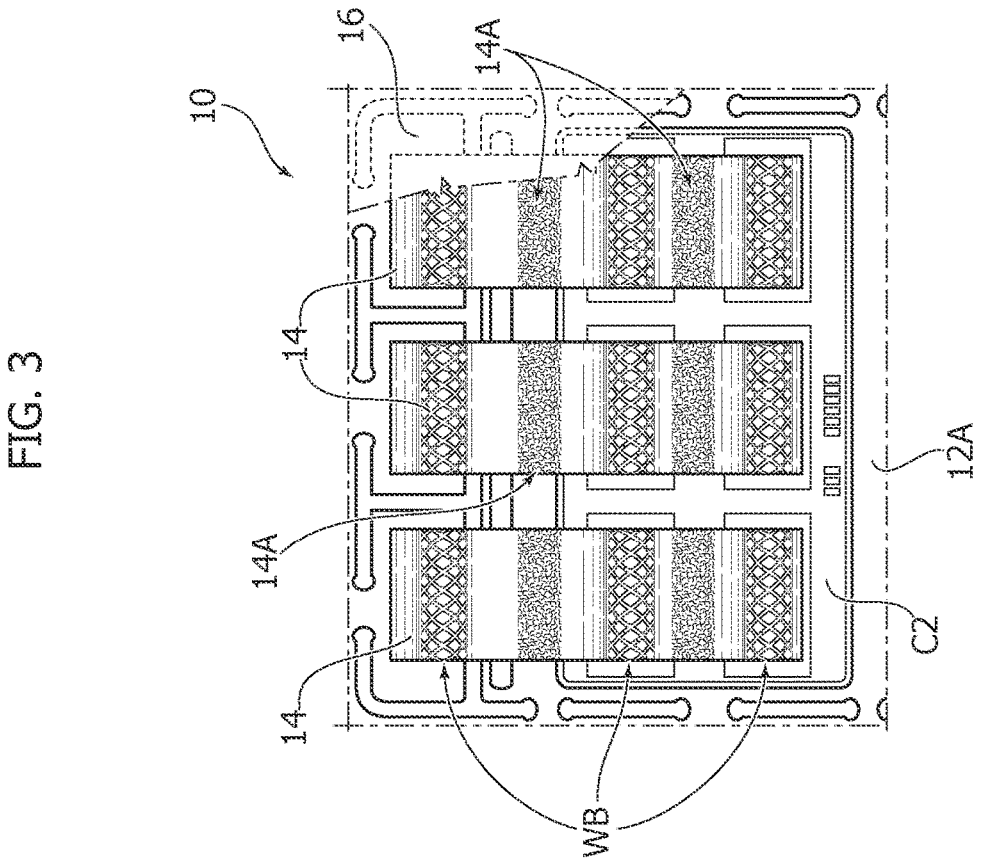

ROUGHENED SURFACE OF A CONDUCTIVE WEDGE BONDED RIBBON ENCAPSULATED IN A SERMICONDUCTOR PACKAGE

PRIORITY CLAIM

This application claims the priority benefit of Italian Application for Patent No. 102021000025523, filed on Oct. 7, 2021, the content of which is hereby incorporated by reference in its entirety to the maximum extent allowable by law.

TECHNICAL FIELD

The description relates to semiconductor devices.

One or more embodiments can be advantageously applied to power semiconductor devices for use in the automotive sector, for instance.

Power Quad-Flat No-leads (QFN) semiconductor devices meeting (low) grade specifications for ambient operating temperature ranges in the automotive sector are exemplary of devices where embodiments can be advantageously applied.

BACKGROUND

Delamination is an effect to keep under control in semiconductor devices such as power semiconductor devices expected to meet automotive grade specifications.

Such devices currently include "ribbons", that is, narrow strips of metal welded, e.g., via ultrasonic bonding, and intended to provide flow paths for (high) currents that may occur in power devices. Ribbon bonding is thus a well-known technique in back end of line (BEOL) manufacturing of semiconductor devices for interconnection purposes.

Conventional ribbons (made of Al or Cu, for instance) are manufactured by lamination. This results in a rather smooth (shiny) external ribbon surface, which facilitates good wedge bonding between ribbons and die bonding pads or leadframe leads.

In power devices such as, for instance, power QFN devices using pre-molded leadframes and wedge ribbon bonding, undesired delamination may occur between the molding material of the package and the device structure that the molding material is intended to encapsulate.

There is a need in the art to contribute in adequately countering undesired delamination.

SUMMARY

One or more embodiments relate to a method.

One or more embodiments relate to a corresponding semiconductor device. A power Quad-Flat No-leads (QFN) semiconductor device for use in the automotive sector may be exemplary of such a device.

One or more embodiments relate to ribbon material for use in manufacturing semiconductor devices. Such a ribbon material can be provided as an intermediate product by a supplier to a manufacturer of semiconductor devices.

One or more embodiments involve ribbon surface roughening, prior to or after an (e.g., ultrasonic) bonding step.

In certain embodiments, ribbon roughening can be implemented on a single ribbon side.

In certain embodiments, ribbon roughening can be implemented on both ribbon sides.

Various embodiments may adopt different techniques (laser engraving or chemical etching, by way of example) for ribbon roughening.

In certain embodiments, roughening can be over the whole length of a ribbon.

In certain embodiments, roughening can be over only a (possibly small) portion of a ribbon, for instance, as a result of roughening only that portion, e.g., by laser machining, optionally after bonding.

One or more embodiments may involve providing a roughened ribbon or forming roughness on at least one surface of the ribbon before wedge bonding.

One or more embodiments may involve forming a ribbon bonding connection and then roughening a portion of the (upper) surface of a ribbon.

One or more embodiments offer one or more of the following advantages: overall reduction of package delamination with obtaining delamination-free packages as a target; ease of use on existing wire (ribbon) bonding machines; a plug & play process is provided (in case of a roughened ribbon available directly on its spool, no extra assembly steps are introduced); wide applicability to several types of leadframe packages; low cost (e.g., if laser engraving is used for roughening); and selectivity, in so far as ribbon roughness patterns can be customized based on the envisaged application.

In comparison with conventional solutions, a ribbon surface according to embodiments will be less smooth and shiny than usual. The ribbon adhesion surface increased via roughening, e.g., via a laser engraving process, will result in stronger adhesion between ribbon and molding compound without adversely affecting bonding of the ribbons onto die bonding pads or leadframe leads.

It is noted that roughening is applied in leadframe finishing. Likewise, attempts at reducing delamination are known that use chemical reactions related to the nature of the molding compound or modified die attach materials such as glues or tape (conductive or insulating) or die passivation materials.

One or more embodiments increase the available surface of the ribbon(s) in order to increase the adhesion area at the interface with the molding compound.

In one or more embodiments, the ribbon surface area can be increased using, for instance, laser engraving: this produces an increased adhesion area with the molding compound (which counters delamination) while at the same time producing a ribbon surface roughened according to a selected engraving pattern (which does not militate against wedge bonding the ribbons onto die bonding pads or leadframe leads).

In certain embodiments, the ribbon roughening process can be performed before the ribbon bonding process step.

In certain embodiments, the ribbon roughening process can be performed after the ribbon bonding process step.

In certain embodiments, depending on the application, roughness can be created (only) at selected ribbon portions.

Various embodiments may contemplate performing the ribbon roughening process on a single side of a ribbon.

Various embodiments may contemplate performing the ribbon roughening process on both sides of a ribbon.

The single side solution offers an advantageous tradeoff between countering delamination and providing an adequate wedge contact area, with the (back or bottom) surface of the ribbon in intimate contact with the metal of the die/leadframe, creating a so-called "wedge".

The double side solution is advantageous in terms of delamination performance in view of the maximization of the adhesion area between the molding compound and the ribbon(s).

BRIEF DESCRIPTION OF THE DRAWINGS

One or more embodiments will now be described, by way of example only, with reference to the annexed figures, wherein:

FIG. 3 is a plan view of a portion of a semiconductor device as illustrated in FIG. 1 to which embodiments of the present description are applied;

FIGS. 4 and 5 are opposed side views of a ribbon according to embodiments of the present description;

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Figure 2:
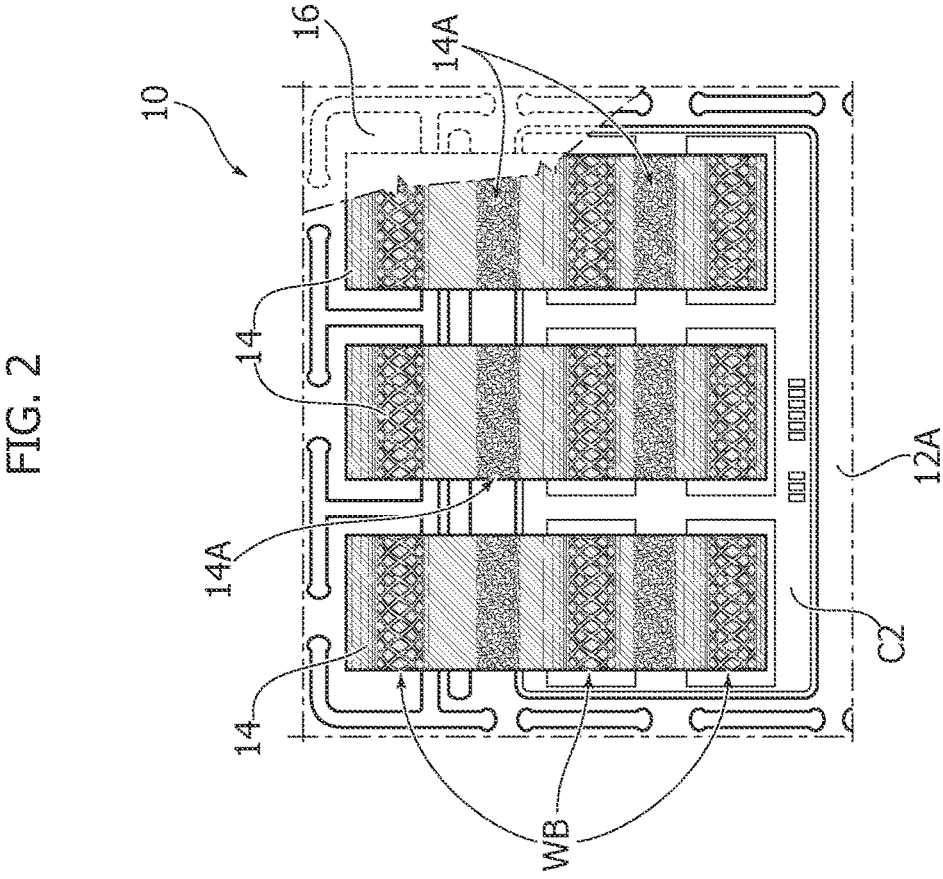
FIG. 2 is a plan view of a portion of a semiconductor device as illustrated in FIG. 1 to which embodiments of the present description are applied.
Figure 1:
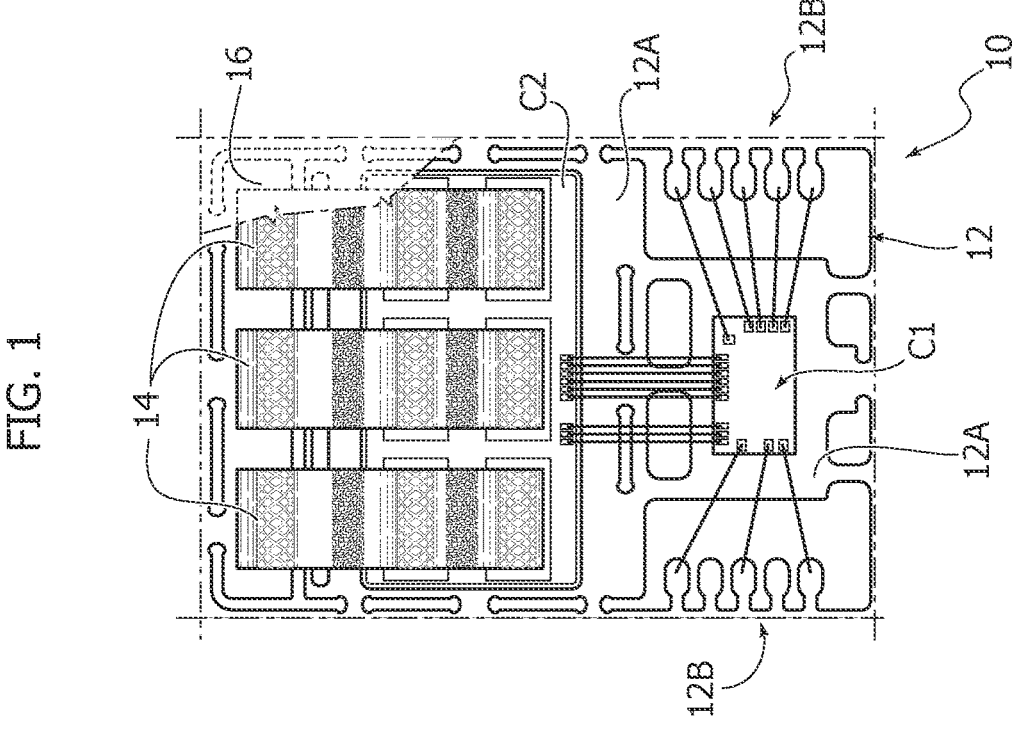
FIG. 1 is a plan view of a semiconductor device comprising ribbons providing power connection channels or paths.
Figures 6A, 6B, 6C, 6D:
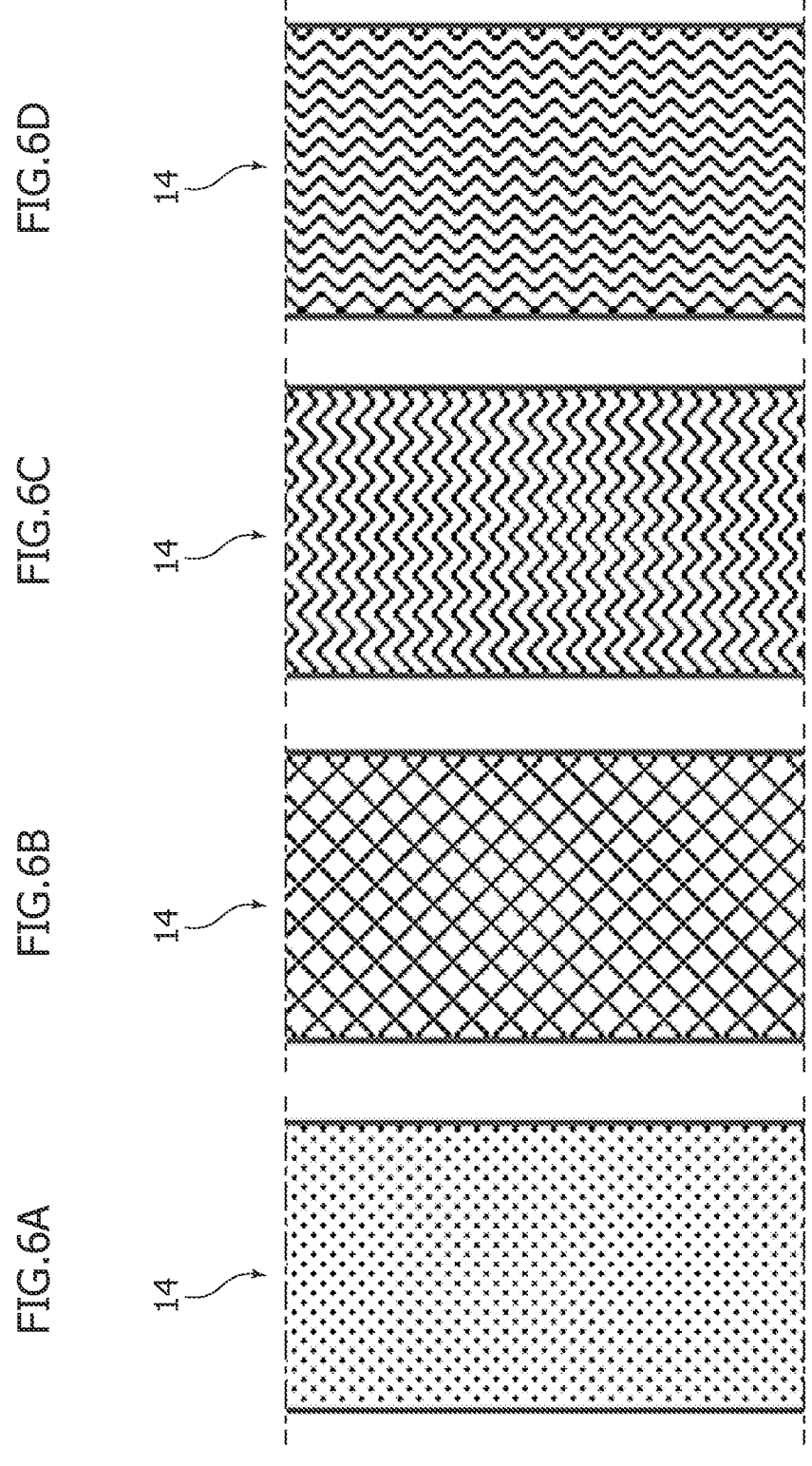
FIGS. 6A, 6B, 6C, 6D illustrate possible roughening patterns that can be used in embodiments of the present description.

A semiconductor device 10 such as a power Quad-Flat No-leads (QFN) device as illustrated in FIGS. 1 to 3 may comprise one or more semiconductor integrated circuit chips (or dice—the terms are used herein as synonyms) C1, C2 arranged, whatever their number and functions, at respective die pads or paddles 12A in a substrate 12 such as a leadframe.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe comprises an array of electrically-conductive formations or leads 12B (see FIG. 1) that from an outline location extend inwardly in the direction of a semiconductor chip or die thus forming an array of electrically-conductive formations from one or more die pads or paddles 12A configured to have at least one semiconductor chip or die attached thereon.

This may be via conventional mounting such as a die attach adhesive (a die attach film (DAF), for instance).

Leadframes are conventionally created using technologies such as a photo-etching technology. With this technology, metal (e.g., copper) material in the form of a foil or tape is etched on the top and bottom sides to create various pads and leads.

Substrates such as leadframes are advantageously provided in a pre-molded version wherein an insulating resin (an epoxy resin, for instance) fills the empty spaces between the die pads 12A and leads 12B.

A pre-molded leadframe 12 is a thus a laminar substrate that is substantially flat with the pre-mold material (resin) filling the spaces in the electrically conductive structure (of metal material such as copper, for instance) of the leadframe, that has been bestowed a sculptured appearance including empty spaces during forming, by etching, for instance.

The total thickness of the pre-mold leadframe is the same thickness of the sculptured electrically conductive structure.

In FIGS. 1 to 3 reference 14 indicates so-called "ribbons", namely narrow strips of electrically conductive materials (copper or aluminum may be exemplary of such a material) providing electrically conductive lines or paths extending over the power dice C2 and configured to carry currents from the power dice C2 to one or more electrical loads (not visible in the figures).

As illustrated in FIGS. 1 to 3, the ribbons 14 may exhibit a wavy (undulated) pattern (denoted by the different surface marking) that facilitates welding through ultrasonic bonding.

Power packages as exemplified in FIGS. 1 to 3 (only the portion with the ribbons 14 is illustrated in FIGS. 2 and 3 for simplicity) may thus include: one or more "power" dice C2 that provide the power section of the device 10; and at least one (e.g., smaller) die C1 acting as a controller and coupled both to the power die or dice C2 and to the external leads 12B in the substrate (leadframe) 12.

As noted, ribbons such as 14 are primarily used for "heavy duty" lines while the controller die or dice C1 are usually wire bonded with thin wire.

A molding compound (an epoxy resin, for instance) 16 is molded onto the assembly illustrated in FIGS. 1 to 3 to provide an insulating encapsulation of the device 10.

Throughout the figures, parts or elements like or similar to parts or elements already discussed in connection with FIG. 1 are indicated with the same reference symbols and a corresponding detailed description will not be repeated for brevity for, e.g., FIGS. 2 and 3: it will be otherwise understood that, unless the description and/or the context indicate differently, the description of the device 10 provided in connection with FIG. 1 also applies to the devices 10 (partially) illustrated in FIGS. 2 and 3.

Arrangements as illustrated in FIGS. 1 to 3 are thus exemplary of devices 10 comprising a substrate (leadframe 12) having arranged thereon at least one semiconductor die (namely C2) and at least one electrically conductive ribbon 14 that provides a current flow path for the at least one semiconductor die C2.

As illustrated in FIGS. 1 to 3, the ribbon or ribbons 14 extend over the die or dice C2 so that the die or dice C2 lie intermediate the substrate 12 and the ribbon(s) 14.

Arrangements as illustrated in FIGS. 1 to 3 are likewise exemplary of devices 10 comprising an (electrically) insulating encapsulation 16 molded onto the substrate 12 having the semiconductor die or dice C2 and the ribbon(s) 14 arranged thereon. The insulating encapsulation 16 (a molding compound, such as an epoxy resin, for instance) encapsulates the semiconductor die o dice C2 and the ribbon(s) 14.

Arrangements as illustrated in FIGS. 1 to 3 are increasingly in demand for use in the automotive sector.

Specifications for these device packages are established in documents such as Automotive Electronics Council (AEC) Document AEC-100, where part operating temperature grades are defined as: Grade 0: −40° C. to +150° C.; Grade 1: −40° C. to +125° C.; Grade 2: −40° C. to +105° C.; Grade 3: −40° C. to +85° C.; and Grade 4: 0° C. to +70° C. ambient operating temperature range.

Package features such as leadframe finishing, molding compound, die attach glue are chosen in order to comply with lower (Grade 0 being more stringent than Grade 4) grade levels.

A factor to keep under control for grade assignment is delamination between the molding compound 16 and the device structure intended to be encapsulated thereby.

The ribbons 14 are conventionally formed as narrow strips of metal welded, optionally through ultrasonic bonding via so-called "wedges", that is, with the formation of compressed (ultrasonically bonded) areas WB of the ribbon and the underlying bonding surface.

Delamination essentially occurs when two or more materials intended to be firmly bonded together (such as a leadframe and a molding compound molded thereon) fracture or separate into layers.

Delamination is an important factor for package reliability. Even a small delaminated spot can in fact spark delamination that propagates to the package edges and facilitates penetration of moisture into the package.

This possible event is related to a high risk of failure as highlighted by thermal cycling and humidity tests and may affect board assembly/preconditioning as well as system functionality.

For instance, a possible moisture-induced failure is the corrosion of aluminum patterns (pads, wires/ribbons, conductors) that takes place due to aluminum (Al) diffusion. A so-called "pop-corn" effect can also be induced by moisture: if a device whose package has absorbed an excessive amount of moisture is passed through a reflow step, the rapid rise in temperature causes the absorbed water to vaporize, which leads to the formation of cracks or even to package popping.

Even without wishing to be bound to any specific theory in that respect, one may note the following:

A semiconductor device package as discussed in the foregoing comprises different materials with different thermo-mechanical properties. Stresses inevitably develop at the interfaces between these materials and delamination occurs in response to adhesion being less than stress. Stress primarily depends on package dimensions and design, while adhesion is a factor that can be improved by acting on mechanical and chemical interfacial interaction between materials;

Mechanical interaction is related to surface roughness. Roughness affects mechanical interlocking (micro cavities) and the contact (interface) area is increased by roughness: a typical example is a leadframe that can include a rough bare material or a finishing of a rough material; and Chemical interaction is related to an (increased) hydrogen bond link between the interfaced material. As example, usually the molding compound and/or die attach material and/or die passivation are chemically enriched with adhesion promoter substances.

In conventional solutions as exemplified in FIG. 1 the surface of the wavy or undulating ribbons 14 is smooth (e.g., shiny).

A solution as exemplified in FIG. 1 does not consider mechanical adhesion of the molding compound to the ribbon material: in fact, the ribbon/molding compound interface is just a small portion of the surface onto which the encapsulation of molding compound 16 is molded.

It was noted that, irrespective of the foregoing, a smooth ribbon surface (which results in a poor adhesion of the molding compound to the ribbons 14) may trigger undesired extensive delamination even if other measures as discussed previously are taken to counter delamination.

Examples as considered herein in connection with FIGS. 2 to 8 increase the available surface of the ribbon(s) 14 thus increasing the adhesion (interface) area of the molding compound 16 to the ribbon(s) 14.

The ribbon surface can be increased by roughening that surface using, for instance, a laser engraving method as known per se to those of skill in the art.

Advantageously, the roughened ribbon surface can be produced at the time of the ribbon manufacturing itself (lamination), through the use of one or more rollers comprising a sculptured surface pattern adapted to imprint the laminated material, on one or two of its faces.

That method will generate a rough(ened) ribbon surface according to a desired pattern chosen for the engraving process.

As used herein, wording such as rough/roughen/roughened corresponds to the current meaning of (making) a surface uneven and not smooth.

One or more embodiments take into account the fact that a roughness value and other surface characteristics (like the orientation and pitch of roughness or the type of roughening process) bestowed upon a surface of a ribbon are related to factors like: stresses, speed and movement direction of drawing step, physical characteristics of the material, presence/absence of lubrication during roughening process, surface aesthetics, etc.

Roughness, therefore, may depend on the nature of the ribbon surface, taking into account the working conditions.

By way of example, a conventional process for standard ribbons will create a surface with a roughness Ra value lower than 1.2 microns (even much less than that, e.g., 0.2 microns).

For the purposes herein, a ribbon surface can be regarded as being rough when having a roughness Ra value in excess of 1.2 micron.

Out of many different roughness parameters in use, is by far the most common: is defined as the arithmetic average value of filtered roughness profile determined from deviations about the center line within the evaluation length.

Similarly, wording such as engrave/engraving as used herein corresponds to the current meaning of cutting or carving (a text or design) on the surface of a (hard) object.

As noted, a ribbon roughening process as considered herein can be carried out before or after the ribbon bonding process step, that is before or after the ribbon(s) 14 are bonded (e.g., wedge-bonded) onto the device 10, for instance—by referring to the examples considered herein— onto the chip C2.

Advantageously, the roughened ribbon surface can be produced at the time of the ribbon manufacturing itself (lamination), through the use of one or more rollers comprising a sculptured surface pattern adapted to imprint the laminated material, on one or two of its faces.

Irrespective of how and when produced, such a roughened surface provides a roughened coupling interface to the insulating encapsulation 16.

In certain embodiments, depending on the intended application, the roughness can be created over the whole extension of a ribbon 14 or over only a portion of a ribbon 14.

FIG. 2 refers to an example where the material for the ribbons 14 has been roughened (e.g., via laser beam processing such as engraving to produce, e.g., a diagonal grooving across the ribbon surface) before the ribbons 14 are wedge-bonded onto the chip C2.

In fact, in FIG. 2 the "diamond-like" pattern of wedge bonding WB is superposed on the (here grooved) pattern resulting from laser beam processing.

FIG. 3 refers to an example where the material for the ribbons 14 has been roughened after the ribbons 14 have been wedge-bonded onto the chip C2.

In fact, in FIG. 3 the (here, generally roughened) appearance extends over the diamond-like pattern of wedge bonding WB: it is otherwise noted that, in certain embodiments, surface roughening of the ribbons 14 may be provided only at those (undulated) portions of the ribbons 14 that are not affected by the diamond-like pattern of wedge bonding WB.

A roughening process as discussed herein can be implemented: on a single ribbon side 14A (FIG. 4, left) with the other side 14B being left smooth (FIG. 4, right), or on both ribbon sides, with both ribbon sides 14A and 14B roughened (see FIG. 5).

A "single-side" solution as illustrated in FIG. 4 provides a good tradeoff between increased resistance to delamination and wedge contact area, with the back or bottom side 14B of the ribbon, left smooth, suited to be in intimate contact with the metal of the die/leadframe, creating a strong wedge bonding thereto.

A "double-side" solution as illustrated in FIG. 5 will provide further improved performance in terms of delamination due to the adhesion area between the molding compound and the (roughened) ribbon surface being maximized.

It is noted that the foregoing (single-side option/double-side option) applies substantially irrespective of the technique (e.g., laser engraving, rolling, chemical etching) used to roughen the surface(s) of the ribbon material 14.

Figures 7, 8:
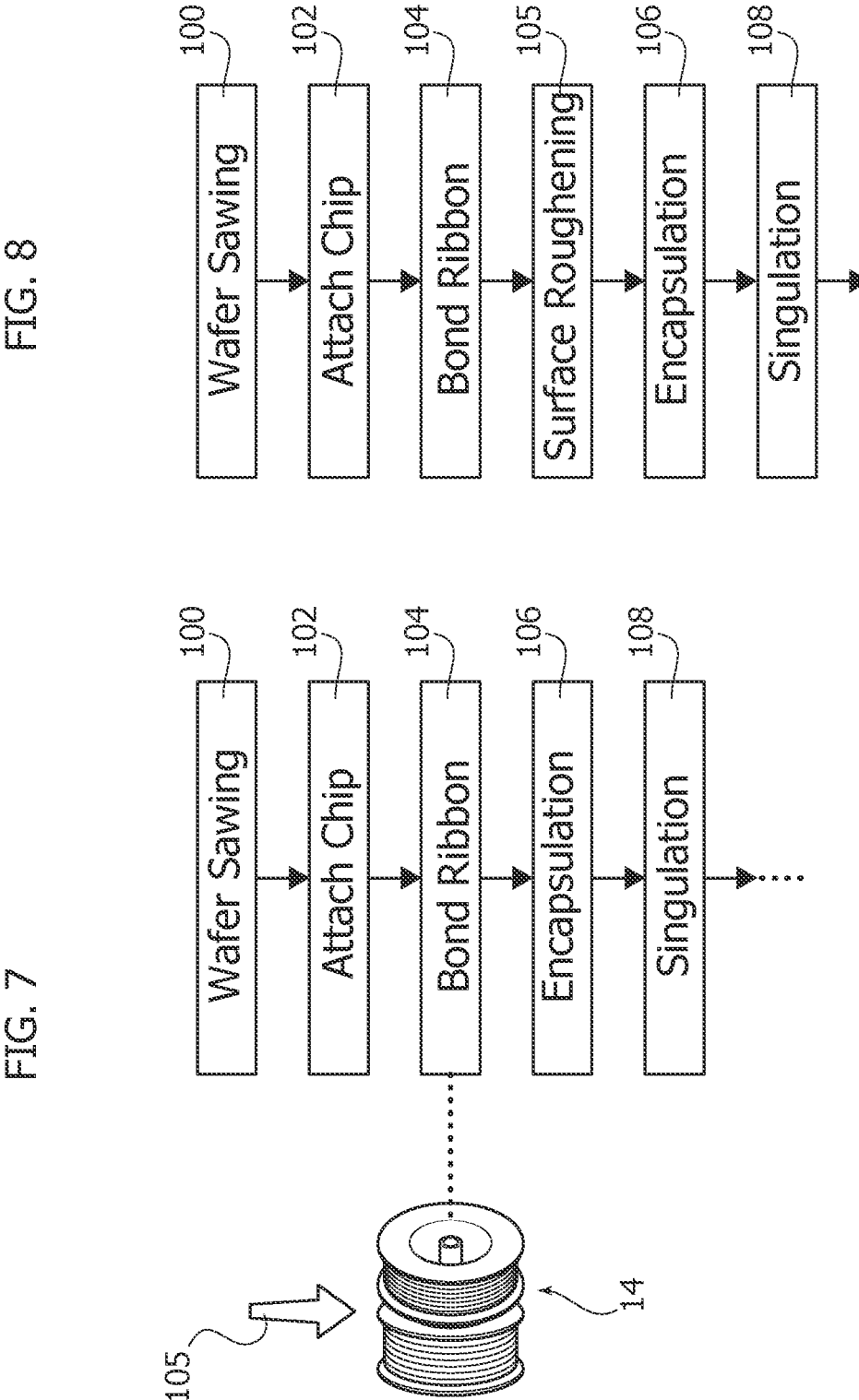
FIGS. 7 and 8 are flow charts exemplary of possible sequences of steps in embodiments of the present description.

Roughening by rolling (e.g., imprinting a sculptured pattern into the ribbon material during ribbon lamination) was found to be advantageous in those cases where ribbon roughening is performed prior to arranging the ribbons 14 onto (the dice C2 and) the substrate 12 (e.g., as schematically represented on the left-hand side of FIG. 7, where a pre-roughened ribbon material is illustrated as an intermediate product provided by a supplier to a manufacturer of semiconductor devices.

As illustrated in FIGS. 2, 4 and 6A to 6D, several options are available for ribbon roughness patterns formed as regular and geometric motifs repeated in an orderly manner (typical of laser engraving or mechanical lamination roughening process) as an alternative to rough surfaces with irregular patterns (typical of chemical roughening process).

Common pattern features may include a (diagonal) linear grooved pattern (FIGS. 2, 4 and 5), a dotted pattern (FIG. 6A), a waffle-grid pattern (FIG. 6B) or zig-zag patterns having either horizontal (FIG. 6C) or vertical (FIG. 6B) orientation. All these solutions were found to improve the grip and coupling between a ribbon and the molding compound surrounding the ribbon.

All these patterns can be produced on one side only (FIG. 4) or on both sides (FIG. 5) of a ribbon 14.

The flow-charts of FIGS. 7 and 8 are exemplary of possible sequences of steps in embodiments.

It will be appreciated that, taken per se, the steps or acts of FIGS. 7 and 8 lend themselves to being performed in a manner known to those of skill in the art.

It will be otherwise appreciated that the sequences of steps or acts of FIGS. 7 and 8 are merely exemplary in so far as: one or more steps illustrated can be omitted, performed in a different manner (with other tools, for instance) and/or replaced by other steps; additional steps and may be added; and one or more steps can be carried out in a sequence different from the sequence illustrated.

In both FIGS. 7 and 8, the blocks 100, 102 and 104 are exemplary of manufacturing steps or phases such as: wafer sawing (block 100), attaching the chips or dice C1, C2 on the leadframe 12 (block 102), and bonding the ribbons 14 (block 104).

In embodiments as exemplified in FIG. 6, ribbon material is used in the bonding step 104 that has been already roughened in a roughening (e.g., rolling) step as exemplified by arrow 105.

This may be on a single (e.g., front or top) side 14A—as illustrated in FIG. 4—or on both sides 14A, 14B—as illustrated in FIG. 5.

As schematically represented on the left-hand side of FIG. 7 such a pre-roughened ribbon material can be provided as an intermediate product by a supplier to a manufacturer of semiconductor devices.

In that case, the (main) assembly flow—using pre-roughened ribbon material for ribbon bonding—remains substantially unchanged with respect to a standard assembly flow using smooth (un-roughened) ribbon material.

In embodiments as exemplified in FIG. 8, ribbon material is used in the bonding step 104 that is roughened (e.g., at a front or top side 14A—as illustrated in FIG. 4) during an additional in-line roughening step 105 performed, e.g., by laser engraving.

In either case (FIG. 7 or FIG. 8) the electrically conductive ribbon 14 comprises a roughened surface (14A, and, possibly, 14A plus 14B providing a roughened coupling interface to the insulating encapsulation 16.

In both FIGS. 7 and 8, the blocks 106 and 108 are exemplary of final manufacturing steps or phases such as: molding the encapsulation 16 (block 106), and package singulation (block 108) to produce individual devices 10: as otherwise conventional in the art, plural devices 10 can be produced simultaneously to be finally separated via singulation (using a cutting blade, for instance).

It is noted that: examples as discussed herein apply to any number of ribbons 14; showing plural ribbons such as, e.g., three ribbons 14, is thus merely exemplary and non-limiting of the embodiments; and/or examples as discussed herein are compatible with creating, in arrangements comprising plural ribbons 14, electrically conductive paths coupling neighboring ribbons 14 as disclosed in U.S. patent application Ser. No. 17/848,958, filed Jun. 24, 2022, claiming priority from Italian patent application 102021000017207, filed Jun. 30, 2021, assigned to the same assignee of the present application (the disclosures of which are hereby incorporated by reference).

Without prejudice to the underlying principles, the details and the embodiments may vary, even significantly, with respect to what has been described by way of example only without departing from the scope of the embodiments.

The claims are an integral part of the technical teaching provided herein in respect of the embodiments.

The extent of protection is determined by the annexed claims.

The invention claimed is:

1. A method, comprising:
arranging at least one semiconductor die and at least one electrically conductive ribbon on a substrate, the at least one electrically conductive ribbon being wedge bonded to the at least one semiconductor die and providing a current flow path for the at least one semiconductor die;
wherein the at least one electrically conductive ribbon comprises a roughened surface; and
molding an insulating encapsulation onto the at least one semiconductor die and the at least one electrically conductive ribbon, wherein the insulating encapsulation encapsulates the at least one semiconductor die and the at least one electrically conductive ribbon, and wherein the roughened surface provides a roughened coupling interface to said insulating encapsulation.

2. The method of claim 1, wherein the at least one electrically conductive ribbon further comprises first and second opposed surfaces, wherein the first surface is the roughened surface and the second surface is a smooth surface, and wherein the second surface is arranged facing the at least one semiconductor die.

3. The method of claim 1, wherein the at least one electrically conductive ribbon comprises first and second opposed surfaces, wherein the first surface is the roughened surface and the second surface is also a roughened surface arranged facing the at least one semiconductor die.

4. The method of claim 1, further comprising providing said roughened surface by one of laser engraving, rolling and chemical etching.

5. The method of claim 1, further comprising providing said roughened surface in the at least one electrically conductive ribbon prior to arranging the at least one electrically conductive ribbon onto the substrate.

6. The method of claim 1, further comprising providing said roughened surface in the at least one electrically conductive ribbon after arranging the at least one electrically conductive ribbon onto the substrate.

7. The method of claim 1, further comprising providing said roughened surface over only a portion of the at least one electrically conductive ribbon.

8. The method of claim 1, further comprising providing said at least one electrically conductive ribbon with a wavy undulating surface to facilitate said wedge bonding.

9. A device, comprising:
a substrate;
at least one semiconductor die and at least one electrically conductive ribbon arranged on the substrate, the at least one electrically conductive ribbon being wedge bonded to the at least one semiconductor die and providing a current flow path for the at least one semiconductor die;
wherein the at least one electrically conductive ribbon comprises a roughened surface; and
an insulating encapsulation molded onto the at least one semiconductor die and the at least one electrically conductive ribbon;
wherein the insulating encapsulation encapsulates the at least one semiconductor die and the at least one electrically conductive ribbon; and
wherein the roughened surface provides a roughened coupling interface to said insulating encapsulation.

10. The device of claim 9, wherein the at least one electrically conductive ribbon comprises first and second opposed surfaces, and wherein the first surface is roughened and the second surface is smooth, and wherein the second surface is arranged facing the at least one semiconductor die.

11. The device of claim 9, wherein the at least one electrically conductive ribbon comprises first and second opposed surfaces, and wherein both said first and second opposed surfaces are roughened.

12. The device of claim 9, wherein said roughened surface is provided over only a portion of the at least one electrically conductive ribbon.

13. The device of claim 9, wherein said at least one electrically conductive ribbon includes a wavy undulating surface supporting said wedge bonding.

14. An electrically conductive ribbon configured to provide a current flow path for at least one semiconductor die arranged on a substrate, wherein the at least one electrically conductive ribbon is configured for wedge bonding to the at least one semiconductor die and comprises a roughened surface configured to provide a roughened coupling interface to an insulating encapsulation molded onto the substrate having the at least one semiconductor die and the at least one electrically conductive ribbon arranged thereon.

15. The electrically conductive ribbon of claim 14, wherein the at least one electrically conductive ribbon comprises first and second opposed surfaces, wherein the first surface is roughened and the second surface is smooth.

16. The electrically conductive ribbon of claim 14, wherein the at least one electrically conductive ribbon comprises first and second opposed surfaces, wherein both said first and second opposed surfaces are roughened.

17. The electrically conductive ribbon of claim 14, wherein said roughened surface is provided over only a portion of the at least one electrically conductive ribbon.

18. The electrically conductive ribbon of claim 14, wherein said at least one electrically conductive ribbon includes a wavy undulating surface configured to facilitate said wedge bonding.

* * * * *